United States Patent [19]
Fong

[11] 3,944,932
[45] Mar. 16, 1976

[54] RECEIVER FILTERING OUT BOTH SYSTEMATIC PULSE NOISE AND RANDOM NOISE

[75] Inventor: Kouan Fong, Schenectady, N.Y.
[73] Assignee: General Electric Company, Schenectady, N.Y.
[22] Filed: Dec. 5, 1974
[21] Appl. No.: 530,128

[52] U.S. Cl. ............... 325/427; 325/425; 325/477
[51] Int. Cl.² .......................................... H04B 1/16
[58] Field of Search ........... 325/322, 323, 347, 394, 325/397, 400, 425, 427, 477, 490, 321, 325, 326, 363, 67; 333/70 T; 179/15 AA, 1 D, 1 P

[56] References Cited
UNITED STATES PATENTS

| | | | |
|---|---|---|---|
| 3,140,486 | 7/1964 | Gillmer | 325/322 |
| 3,292,088 | 12/1966 | Martin et al. | 325/347 |
| 3,462,691 | 8/1969 | McDonald | 325/477 |
| 3,671,867 | 6/1972 | Schwarz | 325/323 |
| 3,714,581 | 1/1973 | Sage | 325/323 |
| 3,781,688 | 12/1973 | Rannells | 325/321 |

Primary Examiner—Albert J. Mayer
Attorney, Agent, or Firm—Daniel R. Levinson; Joseph T. Cohen; Jerome C. Squillaro

[57] ABSTRACT

A continuous wave (c.w.) receiver is described comprising an amplitude limiting section, a commutating filter section, peak detecting means, and a threshold device. The receiver detects the presence or absence of an incoming signal over a very narrow, adjustable bandwidth. The limiting section clips the signal and noise at a predetermined amplitude and, in combination with the commutating filter, reduces the effect of noise, particularly impulse noise. The peak detector selects the highest output from the commutating filter and, in combination with the commutating filter, performs a pseudo-synchronization function when the received signal and an internal signal are not synchronized exactly.

15 Claims, 3 Drawing Figures

RECEIVER FILTERING OUT BOTH SYSTEMATIC PULSE NOISE AND RANDOM NOISE

This invention relates to continuous wave (c.w.) or tone receivers and, in particular, to a receiver for detecting the presence or absence of a signal in the presence of impulse noise, where the amplitude of the impulse noise exceeds both the amplitude of the signal and wide-band random noise.

This invention finds a particular application in the two-way communication system utilizing an electric power distribution network as the transmission medium, as disclosed in application Ser. Nos. 529,998; 529,599; 530,000; and 530,129, filed concurrently herewith and assigned to the same assignee of the present invention.

As described therein, a power-line network is an exceedingly noisy environment in which to communicate reliably. A major portion of the noise energy is harmonically related to the 60-Hertz power frequency in the form of many short pulses (much shorter than a millisecond) spaced randomly in every cycle but which repeat with the same spacing in subsequent cycles. Two major sources of these noise impulses are believed to be the corona dishcarge over bushings in power distribution lines and the switching transients produced in the SCR devices connected on the power lines. The peak power of individual impulses may be a thousand times more than the received signal power in the communication system of this invention. Wide-band random noises also on the same power line are not only harmonically unrelated to the power frequency, but also are significantly smaller than (e.g., no more than a few percent of) the impulse noises described above.

While some prior art receivers have utilized sampling circuits as narrow band filters, these receivers are not intended for or usable in an extremely noisy environment, e.g., as presented by a power distribution network. Further, these prior art receivers do not utilize the amplitude filtration, before and after frequency filtration, as utilized in the present invention, nor is the sampling circuit combined with a peak detector to provide a pseudo-synchronization function when the received signal and the sampling signal are not synchronized exactly.

In view of the foregoing, it is an object of the present invention to provide a c.w. receiver for receiving signals in an environment where the amplitude of the noise exceeds the amplitude of the signal.

Another object of the present invention is to provide a noise tolerant receiver in which amplitude filtering is combined with frequency filtering to minimize the effect of a specific type of noise.

A further object of the present invention is to provide a tone receiver tolerant of both systematic and random noise.

Another object of the present invention is to provide a tone receiver tolerant of phase shifts between the received signal and a local signal.

The foregoing objects are achieved in the present invention wherein an amplitude limiter is followed by a commutating filter. The output of the commutating filter is coupled to a peak detector for selecting the largest output of the integrating capacitors of the commutating filter. The output of the peak detector is coupled to a voltage comparator for providing an output signal indicative of a signal being received within the predetermined passband having an amplitude exceeding a predetermined threshold.

A more complete understanding of the present invention can be obtained by considering the following detailed description in conjunction with the accompanying drawings, in which.

Figure 1:
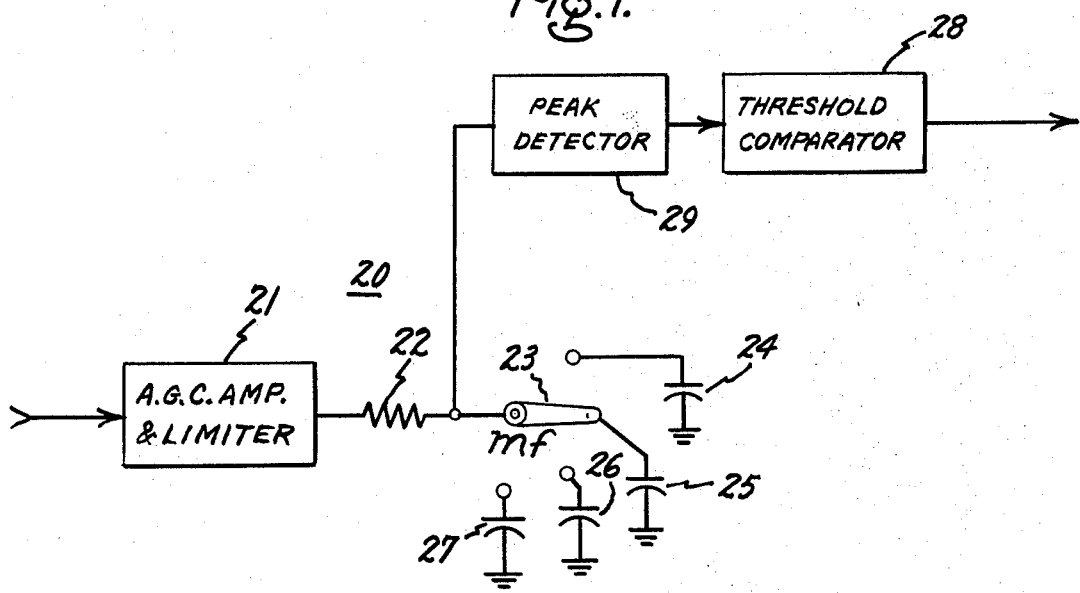
FIG. 1 illustrates the basic receiver in accordance with the present invention.

In FIG. 1, tone receiver 20 comprises an automatic gain control (A.G.C.) amplidier and limiter 21; a commutating filter comprising resistor 22, single pole-multiposition switch 23 and capacitors 24–27; peak detector 29; and threshold comparator 28.

A.G.C. amplifier and limiter 21 serve to amplify the incoming signal and noise to an approximately uniform level and also to clip any incoming signals and noise exceeding a predetermined level. As previously indicated, a power line is an exceedingly noisy environment in which to communicate. A.G.C. amplifier and limiter 21 serve to exclude a certain amount of that noise from the receiver.

Figure 2:
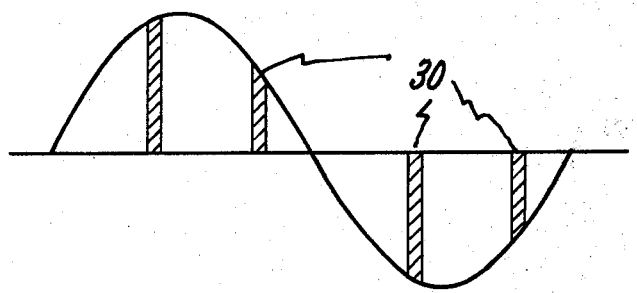
FIG. 2 illustrates the operation of the receiver of the present invention.

The commutating filter may best be understood in conjunction with FIG. 2, wherein a sinusoidal waveform is illustrated as having samples 30 taken at particular points in the waveform. The commutating filter operates on the basis that the theoretical average for noise (i.e., unwanted signals) is zero; that is, noise contains approximately equal positive and negative components. The commutating filter comprises an R.C. network wherein a resistor and a plurality of capacitors are connected by multiposition switch 23. The common terminal of switch 23 is connected by peak detector 29 to threshold comparator 28. If the number of the position of switch 23 is $m$, the switch changes position at a switching or commutation frequency equal to $m$ times the frequency of the desired incoming signal, where $m$ is an integer equal to the number of capacitors in the filter, so that the switch completed one rotation per cycle of incoming signal.

As switch 23 rotates, connecting resistor 22 to different ones of the capacitors, a series of samples is taken of the incoming signal. As can be readily appreciated, if the incoming signal has the same frequency as the rotation of switch 23, then samples 30 are taken at the same points in the waveform for many cycles of the incoming signal. Because there are even spaced samples in a cycle of sine waves, if the frequency of the switch and signal are in synchronization, one of the switch points must always be sampled near the peak value of the incoming signal. Then, as the output of the sampled signal is rectified in the peak detector, a certain charge in every cycle of the highest sampled value charges an integrating capacitor. The voltage thereon builds up according to the time constant of R-C combination and eventually will reach approximately the peak value of the signal. As this d.c. voltage is measured by threshold comparator 28, a value exceeding a preset threshold will indicate the presence of the desired signal. Threshold comparator 28 thereupon produces a logic output pulse indicative of the fact that a suitable incoming signal has been received.

As can be appreciated by inspection of FIG. 1, the commutating filter is essentially an R.C. network which integrates the samples of the incoming signal. This integration of the incoming signal serves to reduce the effect of spurious signals that might individually charge one of the capacitors 24–27 sufficiently to actuate threshold device 28. The effect of the peak detector used in the commutating filter is to select the capacitor with the highest sampled voltage of a certain polarity. It performs a function somewhat similar to the operation of synchronization in a phase coherent product detector. However, the commutating filter and peak detector combination performs without the complication of a synchronization device even if the signal frequency and sampling frequency are different, e.g., phase differences of ± 10 radians.

The bandwidth of the commutating filter is inversely proportional to the R.C. time constant, equal to the product of the resistance of resistor 22 and the sum of the capacitances of capacitors 24–27.

The number of positions of switch 23 is not critical, although at least three positions are necessary. A practical range for the number of positions is from three to twelve.

The center frequency of the commutating filter is determined by the commutation frequency applied to switch 23. Only a signal received approximately in synchronism with switch 23 will produce a signal on capacitors 24–27 that does not average zero over a predetermined number of cycles of the incoming signal. Thus, receiver 20 may be utilized to receive an incoming signal of any frequency within the switching capability of switch 23. The only change needed to receive different frequencies is that the commutation frequency be changed to $m$ times the frequency of the desired signal. The commutation signal may be readily derived from a local clock signal by suitable division.

Receiver 20 as illustrated in FIG. 1 includes a mechanical form of commutating filter. In actual practice, the commutating filter may be implemented by discrete semiconductor devices or integrated circuit devices performing the same function as rotating switch 23. For example, a plurality of sampling circuits can be sequentially activated by a ring counter. This type of operation is well known per se in the art. Also, while illustrated by capacitors 24–27, the filtering or averaging portion of receiver 20 may comprise $\pi$-network low-pass filters or other suitable filters. Further information on the operation of the commutating filter can be obtained from LePage, Cahn, Brown, "Analysis of a Comb Filter Using Synchronously Commutated Capacitors", A.I.E.E. transactions, Part I, pages 63–68, 1953.

Figure 3:
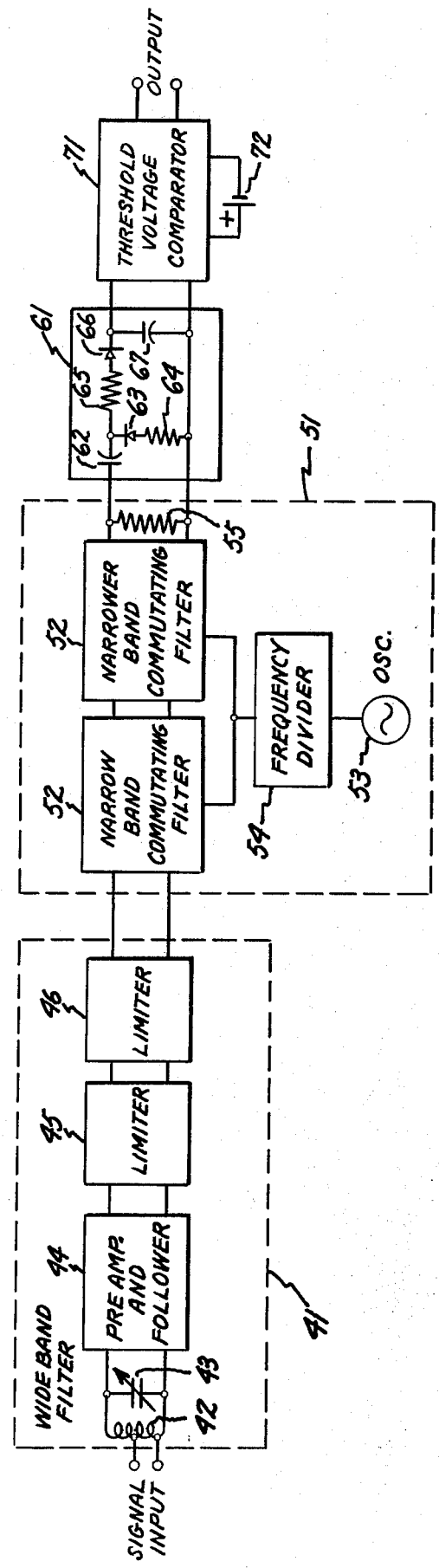
FIG. 3 illustrates in detailed form another embodiment of the present invention.

FIG. 3 illustrates an alternative embodiment of the present invention combining modifications to each of the major sections of the receiver illustrated in FIG. 1. Specifically, receiver 40 comprises pre-amplifier and limiter 41, filter 51, peak detector 61, and threshold voltage comparator 71.

Considering each section in detail, pre-amplifier and limiter comprise an input wide-band filter formed by inductor 42 and capacitor 43, pre-amplifier and follower stage 44, and limiters 45 and 46. Filter 51 comprises narrow-band commutating filter 52, narrower band commutating filter 53, both of which receive a commutating signal from oscillator 53 by way of divider 54, which divides the output of oscillator 53 to the proper commutating frequency. Connected across the output of commutating filter 52 and the input of peak detector 61 is load resistor 55.

Peak detector 61 is actually a voltage doubling peak detector with capacitor 62, diode 63, and resistor 64 comprising the first stage and resistor 65, diode 66, and capacitor 67 comprising the second stage. Resistor 65 of the second stage is connected to the first at the junction of capacitor 62 and diode 63. A simple peak detector that does not act as a voltage doubler would merely comprise the second stage. The output of the peak detector is coupled to one input of threshold voltage comparator 71, well known per se in the art. The other input to comparator 71 is connected to a source of reference potential, represented by battery 72.

The operation of receiver 40 is similar to that of receiver 20, although somewhat more refined. It will be recalled that there are two types of noise, impulse and random. When impulse noise passes through wide-band filter 42–43, it is converted to a damped oscillation at the center frequency of the filter. The duration of the damped oscillation is approximately equal to the reciprocal of the bandwidth of the filter. When this burst of oscillation associated with an impulse is combined with the signal in a limiter, it will produce a square wave essentially controlled by the noise alone, as long as the power of the damped oscillation is significantly larger than the signal power. That is, the duration of the square wave is limited to the duration of the burst of oscillations caused by the impulse noise. If this burst frequency (defined by filter) is sufficiently displaced from the signal frequency, such that the noise phase slips by more than $4\pi$ radians in comparison with the signal phase during the integration times, the bursts will not contribute to the integrated output in commutating filter 51. Therefore, during the integration period T (signal duration), if $n$ impulses occur and the commutating filter bandwidth is $b$, then the fractional reduction of the integrated output is approximately $n/bT$ if $n<bT$, because $n/b$ is the time period where the signal has been swamped by impulse noise through the limiting action of limiters 45 and 46.

On the other hand, the random wide-band noise, after passing through the wide-band filter, can be represented by a phase modulated wave at a frequency defined by the filter. The effect of this noise when combined with the signal in a limiter is to produce phase jitter (or jitter in zero crossing) of the square wave at the signal frequency. The jitter reduces the amplitude of the output from the commutating filter. The fractional reduction for small phase jitter is approximately proportional to the amplitude of phase jitter, but the amplitude of phase jitter for small phase jitter is proportional to the amplitude ratio of noise to signal. Since the amplitude of wide-band random noise from a white noise source is approximately proportional to the square root of the bandwidth defined by the wide-band filter, this can be expressed as $k\sqrt{b}$, where $k$ is a proportionality factor. Thus, if the wide-band filter bandwidth is increased to decrease the duration of the burst of oscillations caused by impulse noise, there is a fractional reduction of the integrated output from the narrow-band filter caused by the impulse noises, while increasing the output due to wide-band random noises. Thus, an optimum wide-band filter bandwidth for the particular application must be provided. This is easily done empirically. In the particular application of using receiver 40 in a communication system using power lines as the transmission medium, this optimum bandwidth has been experimentally established at a few kilohertz for a signal duration on the order of a tenth of a second. Under the conditions described above, $n/bT$ is significantly smaller than one-half. Thus, good noise immunity is achieved by the receiver of the present invention.

The foregoing also applies to receiver 20 where the bandwidth of the input circuit, e.g., a coupler to the power lines (not shown), is considered the bandwidth of a wide-band filter.

The commutating filter and threshold comparator combination used in the receiver work best on a fixed signal level. However, the actual input signal levels at the receiver may vary substantially. As previously described, the A.G.C. pre-amplifier and limiter combination serve to maintain a constant output level. In the noise environment of power distribution lines, and under the restrictions imposed upon the receiver to achieve best immunity to impulse noises, the signal is always overwhelmed by the noise. Thus, the A.G.C. voltage is essentially determined by the noise alone, i.e., noise fluctuations cause signal fluctuations. Also, the time constant associated with the A.G.C. circuit makes it difficult to follow noise fluctuations instantly. It has been found that receiver reliability degrades during noise level fluctuations. In receiver 40, cascaded multistage limiters 45 and 46 are substituted for the A.G.C. limiter combination of receiver 20, resulting in substantially improved receiver performance under dynamic conditions. Because such limiters need to be driven by a low impedance source, while a high impedance input is necessary to preserve the bandwidth of the input tuning circuit, a pre-amplifier with follower output stage precedes the cascaded limiters.

Bandpass selectivity of the commutating filter is derived from the low pass cut-off characteristics of an R.C. filter. Two commutating filters connected in cascade eliminate noise more effectively, with no significant change in their pass-band characteristics. The bandwidth of the two commutating filters is not the same. Specifically, the bandwidth of the first is greater than that of the second, preferably in the ratio of approximately three to one. For example, in a receiver actually constructed, the time constants are 0.05 and 0.15 seconds, corresponding to bandwidths of 20.00 and 6.67 Hz, respectively. This combination of filters produces a receiver having a nominal bandwidth of 7 Hz. Commutating filters with multiple stages of R.C. filters connected in cascade have been described by L. E. Franks and J. W. Sandberg in "An Alternative Approach to the Realization of Network Transfer Functions: The N-Path Filter", pages 1321–1350, Bell System Technical Journal, Vol. 39, Sept., 1960.

The peak rectifier inserted between the commutating filter and the threshold voltage comparator not only rectifies the a.c. output of the filter into d.c., but also serves a self-synchronization function that picks only the capacitor in the filter that is charged by the voltage near peak value. With a simple peak detector, one half of the input signal is not used. A voltage doubling peak rectifier improves the performance of the receiver by appropriately combining the contribution from the negative half-cycle of the incoming signal with the contribution from the positive half-cycle to the output. In particular, this improvement of 3 db in signal-to-noise ratio is the result of coherently combining (doubling) the fixed peak d.c. voltage of the two half-cycles. While the unavoidable noise perturbations on these two d.c. voltages are never the same, they are only combining incoherently (adding randomly).

In an $m$-section commutating filter that switches between $m$ capacitors, each capacitor only charges $1/m$th of a cycle, and the peak detector only selects the capacitor in the filter which is charged to approximately peak voltage. The time constant of a peak detector is defined by the product $RCm$, where $R$ is the resistance of resistor 64 and $C$ is the capacitance of capacitor 62. This time constant should be chosen to eliminate the high frequency ripple caused by the capacitor switching process. For example, in a four-section filter at a center frequency of 40 kHz, a suitable time constant is $180{,}000 \times 0.02 \times 10^{-6} \times 4 = 0.014$ second.

In practice, the synchronization between the incoming signal frequency and the locally generated switching control signal will never be exact because each was derived from its own oscillator. This relative frequency shift manifests itself as a gradual phase shift between the incoming signal and the local switch control voltage.

Clipping of the incoming signal by the limiter also reduces the variation in sampled voltage in a commutating filter caused by this gradual phase shift. Only the two samples that contain the zero crossing point are sensitive to zero crossing location within the sampling interval. The sampled voltage varies between zero and a maximum voltage when the zero crossing is located at the center and edge of the sampling interval respectively. The gradual phase shift causes the impedance at the junction of the commutating filter and the peak detector to fluctuate considerably. These impedance variations produce corresponding variations in the integrated output of the peak detector.

To counteract this effect, load resistor 55 is connected at the output of commutating filter 52 at the input of voltage doubling peak rectifier 61. This resistor should be slightly smaller than series charging resistor 64 used in the voltage doubling rectifier, but substantially larger than the resistor in the commutating filters. This resistor helps to maintain the impedance of the peak rectifier and filter combination nearly constant, which makes the performance of the filter relatively insensitive to the phase changes between the incoming signal and the local switching control signal.

There is thus provided by the present invention a tone receiver that is particularly adapted to receive signals in an exceedingly noisy environment. Specifically, the receiver comprises four stages. The first stage controls the duration of the burst of oscillations caused by impulse noise and the amplitude of random noise admitted to the rest of the receiver. The second stage clips signal and noise exceeding a predetermined amplitude; the third stage is noise tolerant and frequency dependent in sampling the incoming signal at regular intervals and averaging the samples located at a particular phase of the signal frequency over a number of cycles; and the fourth stage is an amplitude selective device, selecting only the samples with the largest amplitude and is tolerant of phase variations due to the load resistor. Thus, the combination of seemingly simple and inexpensive elements produces an economical, narrow band, noise tolerant receiver. It will be apparent to those of skill in the art that various modifications can be made within the spirit and scope of the present invention. For example, any suitable limiter circuit may be used in limiters 21 and 41.

What I claim as new and desire to secure by Letters Patent of the United States is:

1. A receiver for receiving and detecting tone signals in a noisy environment, where the amplitude of impulse noise exceeds the amplitude of the received signal, comprising:
- an amplitude limiting section for excluding noise above a predetermined amplitude;
- a commutating filter section coupled to said amplitude limiting section, for generating a plurality of voltages indicative of a received signal within the passband of the filter section;
- peak detection means, coupled to said commutating filter, for selecting the one of said voltages having the largest amplitude; and
- threshold detecting means, coupled to said peak detecting means, for producing an output signal when said selected voltage exceeds a predetermined threshold to indicate the presence of a received tone.

2. The receiver as set forth in claim 1 wherein said commutating filter section comprises at least two commutating filters connected in cascade.

3. The receiver as set forth in claim 2 wherein said commutating filters have the same center frequencies and different bandwidths.

4. The receiver as set forth in claim 3 wherein the bandwidth of the commutating filter coupled to said amplitude limiting section is wider than the bandwidth of the commutating filter coupled to said peak detecting means.

5. The receiver as set forth in claim 4 wherein said bandwidths are in the ratio of approximately three to one.

6. The receiver as set forth in claim 1 wherein said peak detecting means comprises a voltage doubling peak detector.

7. The receiver as set forth in claim 1 wherein said amplitude limiting section comprises an automatic gain controlled amplifier and an amplitude limiter coupled thereto.

8. The receiver as set forth in claim 1 wherein said amplitude limiting section comprises:
- a wide-band filter having a different center frequency that said commutating filter section;
- a pre-amplifier and follower stage coupled to said wide-band filter; and
- at least two cascaded limiting amplifiers coupled to said follower stage.

9. The receiver as set forth in claim 1 wherein said amplitude limiting section comprises:
- a wide-band filter having a different center frequency than said commutating filter section;
- a pre-amplifier and follower stage coupled to said wide-band filter;
- at least two cascaded limiting amplifiers coupled to said follower stage; and
- wherein said commutating filter means comprises at least two commutating filters connected in cascade.

10. The receiver as set forth in claim 9 wherein said commutating filters have the same center frequencies and different bandwidths.

11. The receiver as set forth in claim 10 wherein the bandwidth of the commutating filter coupled to said amplitude limiting section is wider than the bandwidth of the commutating filter coupled to said peak detecting means.

12. The receiver as set forth in claim 11 wherein said bandwidths are in the ratio of approximately three to one.

13. The receiver as set forth in claim 12 wherein said peak detecting means comprises a voltage doubling peak detector.

14. The receiver as set forth in claim 9 wherein the frequency displacement between the center frequencies of said wide-band filter and said commutating filter causes a phase shift of at least $4\pi$ radians over the duration of the received signal.

15. The receiver as set forth in claim 1 and further comprising means interconnecting the output of said commutating filter means and the input of said peak detecting means for reducing amplitude variations in the output of said peak detector due to phase variations of the received signal.

* * * * *